(12) United States Patent
Yon et al.

(10) Patent No.: US 7,031,179 B2
(45) Date of Patent: Apr. 18, 2006

(54) BIT CELL ARRAY FOR PREVENTING COUPLING EFFECT IN READ ONLY MEMORY

(75) Inventors: Sang-Hoon Yon, Anyang-si (KR); Jeung-Joo Lim, Yongin-si (KR)

(73) Assignee: Samsung Electronics Co., Ltd., (KR)

(*) Notice: Subject to any disclaimer, the term of this patent is extended or adjusted under 35 U.S.C. 154(b) by 0 days.

(21) Appl. No.: 10/958,116

(22) Filed: Oct. 4, 2004

(65) Prior Publication Data
US 2005/0152170 A1 Jul. 14, 2005

(30) Foreign Application Priority Data
Jan. 12, 2004 (KR) ............... 10-2004-0002002

(51) Int. Cl.
*G11C 17/00* (2006.01)
(52) U.S. Cl. .................... 365/94; 365/104; 365/51
(58) Field of Classification Search .............. 365/94, 365/104, 51
See application file for complete search history.

(56) References Cited
U.S. PATENT DOCUMENTS

| | | | |
|---|---|---|---|
| 4,318,014 A | 3/1982 | McAlister et al. ........ 307/463 |
| 4,481,609 A * | 11/1984 | Higuchi et al. ........ 365/185.05 |
| 4,485,460 A | 11/1984 | Stambaugh ............... 365/203 |
| 5,289,406 A * | 2/1994 | Uramoto et al. ............ 365/94 |
| 5,835,421 A | 11/1998 | Pham et al. ........... 365/189.02 |
| 6,243,284 B1 * | 6/2001 | Kumagai .................... 365/104 |
| 6,879,505 B1 * | 4/2005 | Scheuerlein ................ 365/51 |
| 2001/0050866 A1 * | 12/2001 | Khieu ................... 365/189.02 |

* cited by examiner

*Primary Examiner*—Huan Hoang
(74) *Attorney, Agent, or Firm*—Mills & Onello LLP

(57) ABSTRACT

The present invention relates to bit cell arrays of read-only-memories, and more specifically, to a bit cell array capable of preventing a coupling effect between adjacent bit lines. In addition, the bit cell array according to the present invention does not require an additional device in order to prevent the coupling effect. In accordance with the present invention, the bit cell array comprising: a plurality of bit lines arranged in a row in a first direction; a plurality of ground lines in a row in a second direction vertical to the first direction; a plurality of word lines arranged with a zigzag line with respect to the second direction; and a plurality of ROM bit cells partially formed at a cross-section point of the bit lines and the word lines. In the meanwhile, the ROM bit cells are arranged with a zigzag line with respect to adjacent bit lines. Additionally, the ROM bit cells comprise a drain terminal, a gate terminal and a source terminal. The drain terminal is connected to one of bit lines, the gate terminal is connected to one of word lines, and the source terminal is connected to one of ground lines.

11 Claims, 3 Drawing Sheets

BIT CELL ARRAY FOR PREVENTING COUPLING EFFECT IN READ ONLY MEMORY

CROSS-REFERENCE TO RELATED APPLICATIONS

This U.S. non-provisional patent application claims priority under 35 U.S.C. § 119 of Korean Patent Application 2004-02002 filed on Jan. 12, 2004, the entire contents of which are hereby incorporated by reference.

BACKGROUND OF THE INVENTION

Read-only-memories (ROMs) as nonvolatile memories are capable of storing data, even with power turned off. In that the ROM is capable of reading the stored data but is incapable of changing it, the ROM is different from Random Access Memories (RAMs) capable of reading and writing data.

FIG. 1 illustrates a portion of a conventional ROM constructed in accordance with the invention. The illustrated ROM is disclosed in U.S. Pat. No. 5,835,421, entitled, "METHOD AND APPARATUS FOR REDUCING FAILURE DUE TO BIT LINE COUPLING AND REDUCING POWER COMSUMPTION IN A MEMORY".

Referring to FIG. 1, the conventional ROM includes a bit cell array 100. The bit cell array 100 comprises a plurality of bit lines and word lines, which cross each other, and ROM bit cells located at cross points of the bit lines BL1, BL2, BL3 and BL4, and the word lines WL1, WL2, WL3 and Wl4. One ROM bit cell 10 is a basic unit of ROM for storing data. In addition, each of the bit lines BL1, BL2, BL and BL4 is connected to a multiplexer 20, and is selected by bit line select signals SEL1, SEL2, SEL3 and SEL4, which are inputted from a bit line select circuit 120. The ROM bit cells connected to the selected bit line become precharged by a precharge circuit 130 connected to the multiplexer 20, and the stored data is amplified through a sense amplifier 140 to be outputted. In order to prevent data error of the ROM bit cells 10 caused by a coupling effect between adjacent bit lines in precharging, the ROM includes an additional coupling prevention circuit such as the bit line select circuit 120.

In FIG. 1, the bit line select circuit 120 controls adjacent bit lines, e.g., BL1 and BL2, or BL3 and BL4, among bit lines BL1, BL2, BL3 and BL4 of the ROM so as not to be simultaneously selected employing the multiplexer 20 so that the coupling effect between adjacent bit lines can be prevented. The multiplexer 20 may be embodied employing NMOS (N-channel Metal Oxide Semiconductor) transistors.

Techniques for preventing the coupling effect between bit lines of the ROM are disclosed in U.S. Pat. No. 4,318,014, entitled, "SELECTIVE PRECHARGE CIRCUIT FOR READ-ONLY-MEMORY," and U.S. Pat. No. 4,485,460, entitled, "ROM COUPLING REDUCING CIRCUITRY."

While data error caused by the coupling effect between bit lines can be prevented in the above-mentioned patents, there is a disadvantage to the disclosed approaches that operational speed is reduced by selectively precharging bit lines using the NMOS multiplexer circuit.

SUMMARY OF THE INVENTION

The present invention is directed to a read-only-memory having a bit cell array capable of performing a precharge operation while preventing the coupling effect without an additional bit line select circuit including a NMOS multiplexer circuit.

In order to prevent the coupling effect in the read-only-memory, a bit cell array according to the present invention comprises: a plurality of bit lines arranged in a row in a first direction; a plurality of ground lines arranged in a second direction perpendicular to the first direction; a plurality of word lines arranged such that a direction of the word lines changes alternately with respect to the second direction, that is, the word lines have a "zigzag" shape with respect to the second direction and with respect to the ground lines; and a plurality of ROM bit cells partially formed at cross points of the bit lines and the word lines. The ROM bit cells of the present invention are arranged such that a direction in which the ROM bit cells are disposed changes alternately. That is, the ROM bit cells are arranged in a "zigzag" shaped line direction.

In one embodiment, each of the ROM bit cells includes a drain terminal, a gate terminal and a source terminal. The drain terminal is connected to one of the bit lines. The gate terminal is connected to one of the word lines. The source terminal is connected to one of the ground lines.

In one embodiment, two ROM bit cells are formed by four word lines and one bit line.

In one embodiment, each of two ROM bit cells among ROM bit cells formed in one bit line shares one of the ground lines.

In one embodiment, the word lines respectively cross up and down with respect to the bit lines.

In another aspect, the invention is directed to a bit cell array of a read-only-memory comprising: first to fourth bit lines successively formed in a row in a first direction; first to third ground lines successively formed in a row in a second direction perpendicular to the first direction; first to fourth word lines arranged such that a direction of the word lines changes alternately with respect to the second direction, that is, successively formed with a "zigzag" line with respect to the second direction; and a plurality of ROM bit cells partially formed at cross points of the first to fourth bit lines and the first to fourth word lines, wherein the ROM bit cells are arranged such that a direction in which the ROM bit cells are arranged changes alternately so as not to be arranged in a row on adjacent bit lines. That is, the ROM bit cells are arranged in a "zigzag" shaped line direction.

In one embodiment, the first and second word lines are formed between the first ground line and the second ground line, and the third and fourth word lines are formed between the second ground line and the third ground line.

In one embodiment, each of the ROM bit cells comprises: a drain terminal connected to one of the bit lines; a gate terminal connected to one of the word lines; and a source terminal connected to one of the ground lines.

First and second ROM bit cells are formed at cross points of the first bit line and the second and third word lines, the first and second ROM bit cells sharing the second ground line. Third and fourth ROM bit cells are formed at cross points of the second bit line and the first and fourth word lines. Fifth and sixth ROM bit cells are formed at cross points of the third bit line and the second and third word lines, the fifth and sixth ROM bit cells sharing the second ground line. Seventh and eighth ROM bit cells are formed at cross points of the fourth bit line and the first and fourth word lines.

Source terminals of the third and seventh ROM bit cells are connected to the first ground line; and source terminals of the fourth and eighth ROM bit cells are connected to the third ground line.

In one embodiment, the first to fourth word lines are formed crossing up and down with respect to each of the first to fourth bit lines.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DETAILED DESCRIPTION OF PREFERRED EMBODIMENTS

Figure 1:
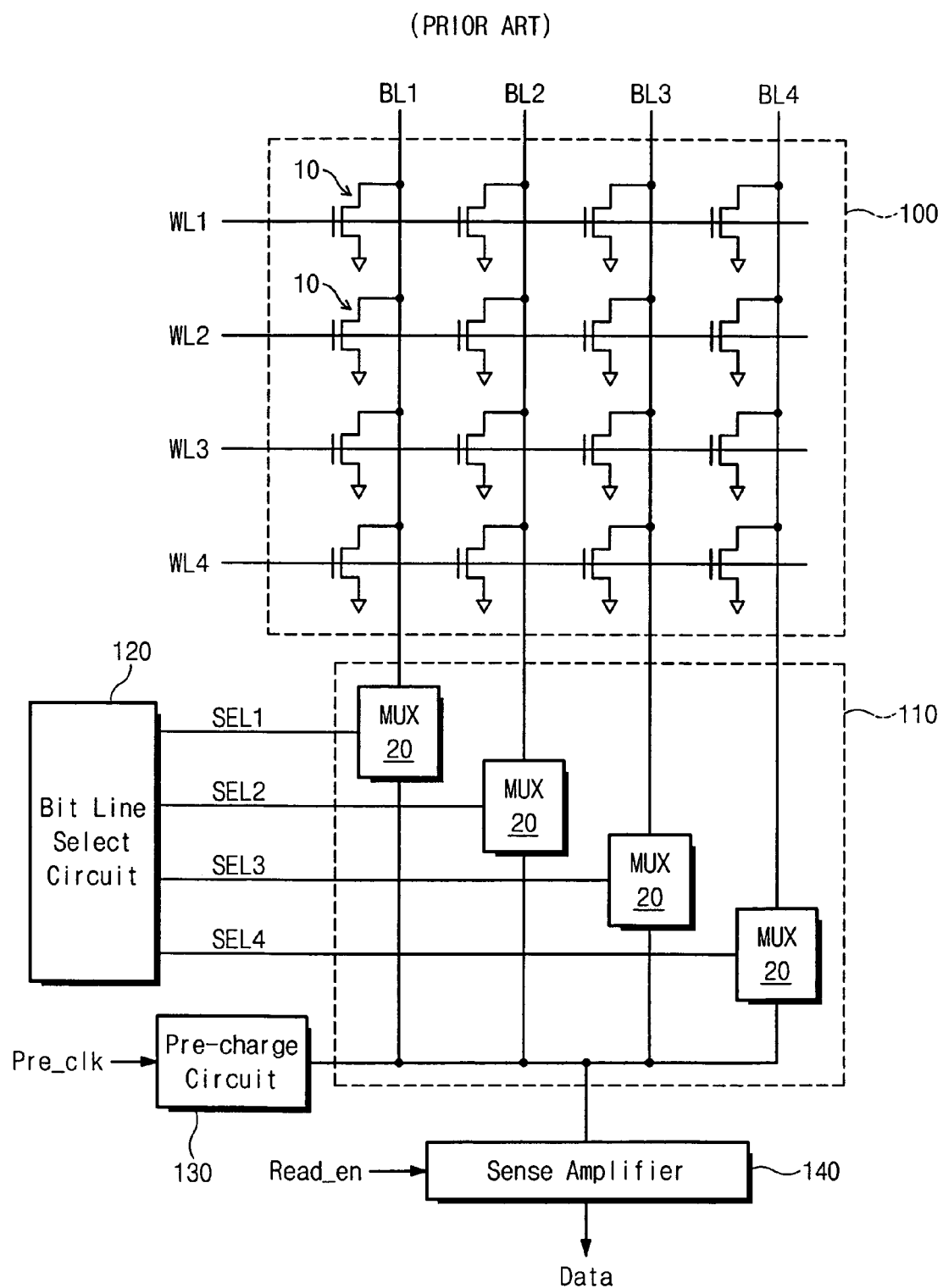
FIG. 1 illustrates a basic structure of a conventional read-only-memory (ROM).
Figure 2:
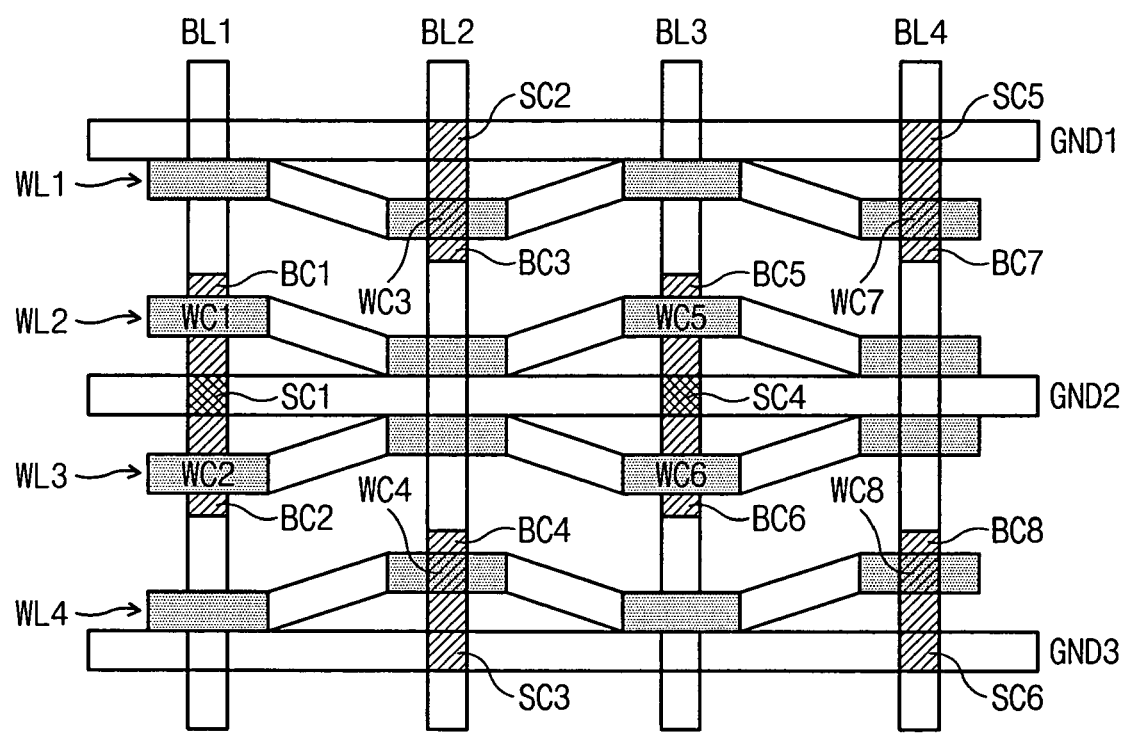
FIG. 2 is a diagram showing an embodiment of a bit cell array by a basic unit capable of preventing a coupling effect between adjacent bit lines in the read-only-memory according to the present invention.

FIG. 2 is a diagram showing an embodiment of a basic unit bit cell array of a memory unit capable of preventing a coupling effect between adjacent bit lines in a read-only-memory according to the present invention.

As a matter of convenience, FIG. 2 only shows the bit cell array of a basic unit of a memory cell. An entire bit cell array is structured by repetition of the basic unit bit cell array. As shown in FIG. 2, the basic unit bit cell array includes four bit lines BL1, BL2, BL3 and BL4, four word lines WL1, WL2, WL3 and WL4, three ground lines GND1, GND2 and GND3, and several ROM bit cells (oblique lines in FIG. 2).

Four bit lines BL1, BL2, BL3 and BL4 are parallel to each other in a first direction.

Three ground lines GND1, GND2 and GND3 are parallel to each other in a direction perpendicular or vertical to the first direction. Each of the ground lines GND1, GND2 and GND3 has a respective ground voltage.

Four word lines WL1, WL2, WL3 and WL4 are arranged with a zigzag line (or a wave line) with respect to the ground lines GND1, GND2 and GND3 in the same direction as the ground lines GND1, GND2 and GND3. That is, a direction of the word lines changes alternately with respect to the ground lines. Each of the bit lines BL1, BL2, BL3 and BL4 cross up and down. More specifically, the first and second word lines WL1 and WL2 are located between the first ground line GND1 and the second ground line GND2. The third and fourth word lines WL3 and WL4 are located between the second ground line GND2 and the third ground line GND3.

ROM bit cells are formed at cross points of the bit lines BL1, BL2, BL3 and BL4, and the word lines WL1, WL2, WL3 and WL4. In order to prevent the ROM bit cells from being located in a row on adjacent bit lines, the ROM bit cells are partially arranged at cross points of the bit lines BL1, BL2, BL3 and BL4, and the word lines WL1, WL2, WL3 and WL4. That is, the ROM bit cells are arranged with a zigzag as shown in FIG. 2. That is, the ROM bit cells are formed on a line that changes direction alternately. In addition, a drain terminal of each of the ROM bit cells is connected to the bit lines BL1, BL2, BL3 and BL4 by bit line contact areas BC1 to BC8. A source terminal of each of the ROM bit cells is connected to the ground lines GND1, GND2 and GND3 by source contact areas SC1 to SC6. A gate terminal of each of the ROM bit cells is connected to word line contact areas WC1 to WC8.

Figure 3:
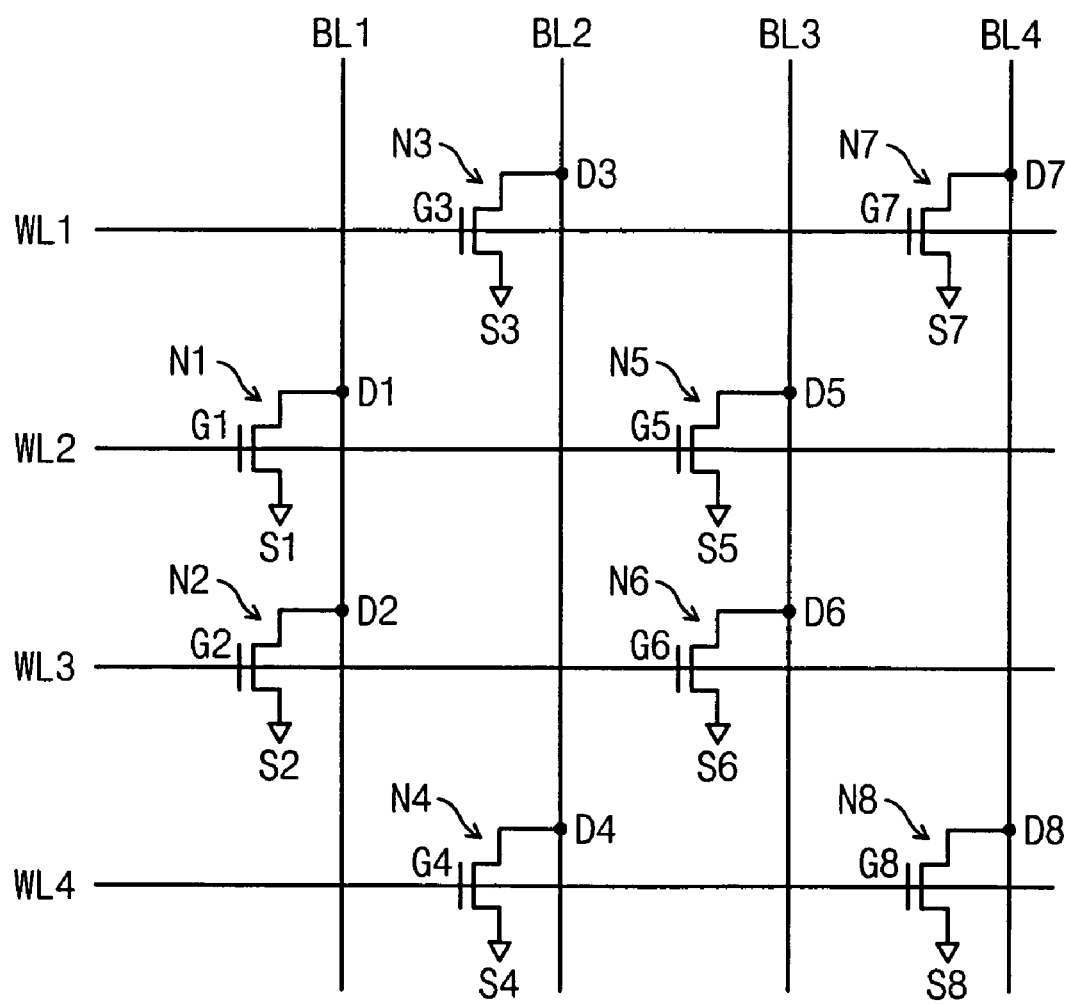
FIG. 3 schematically illustrates the bit cell array by a basic unit of FIG. 2.

FIG. 3 schematically illustrates a basic unit bit cell array taken from the basic unit of FIG. 2. The bit cell array of FIG. 2 according to the present invention will be more fully described referring to FIG. 3. In FIG. 3, each of the word lines WL1, WL2, WL3 and WL4 has wave shape.

As shown in FIG. 3, two ROM bit cells by each bit line are formed with respect to four word lines WL1, WL2, WL3 and WL4 in the bit cell array by a basic unit. That is, first and second ROM bit cells N1 and N2 are formed in the first bit line BL1 with respect to the first to fourth word lines WL1, WL2, WL3 and WL4. Third and fourth ROM bit cells N3 and N4 are formed in the second bit line BL2. Fifth and sixth ROM bit cells N5 and N6 are formed in the third bit line BL3. Seventh and eighth ROM bit cells N7 and N8 are formed in the fourth bit line BL4.

Drain terminals D1 and D2 of the first and second ROM bit cells formed in the first bit line BL1 are connected to the first bit line BL1. A gate terminal G1 of the first ROM bit cell N1 is connected to the second word lines WL2. A gate terminal G2 of the second ROM bit cell N2 is connected to the third word line WL3. And, source terminals S1 and S2 of each of the ROM bit cells N1 and N2 are commonly connected to the second ground line GND2.

Drain terminals D3 and D4 of the third and fourth ROM bit cells N3 and N4 formed in the second bit line BL2 are connected to the second bit line BL2. A gate terminal G3 of the third ROM bit cell N3 is connected to the first word line WL1. A gate terminal G4 of the fourth ROM bit cell N4 is connected to the fourth word line WL4. And, a source terminal S3 of the third ROM bit cell N3 is connected to the first ground line GND1, and a source terminal S4 of the fourth ROM bit cell N4 is connected to the third ground line GND3.

Drain terminals D5 and D6 of the fifth and sixth ROM bit cells N5 and N6 formed in the third bit line BL3 are connected to the third bit line BL3. A gate terminal G5 of the fifth ROM bit cell N5 is connected to the second word line WL2. A gate terminal G6 of the sixth ROM bit cell N6 is connected to the third word line WL3. And, source terminals S5 and S6 of each of the ROM bit cells N5 and N6 are commonly connected to the second ground line GND2.

Drain terminals D7 and D8 of the seventh and eighth ROM bit cells N7 and N8 formed in the fourth bit line BL4 are connected to the fourth bit line BL4. A gate terminal G7 of the seventh ROM bit cell N7 is connected to the first word line WL1. A gate terminal G8 of the eighth ROM bit cell N8 is connected to the fourth word line WL4. A source terminal S7 of the seventh ROM bit cell N7 is connected to the first ground line GDN1, and a source terminal S8 of the eighth ROM bit cell N8 is connected to the third ground line GND3.

As shown in FIG. 3, ROM bit cells enabled by selecting one word line are not located in an adjacent bit line in the bit cell array using the above-described structure as a basic structure according to the present invention. For example, if the second word line WL2 is selected, the first and fifth ROM bit cells N1 and N5 become enabled. As shown in FIG. 3, the enabled first and fifth ROM bit cells N1 and N5 are not located in adjacent bit lines. According to the present invention, additional coupling prevention devices for preventing coupling effect between adjacent bit lines in precharging are not required in the read-only-memory including the bit cell array.

As previously described, the bit cell array of the read-only-memory according to present invention can prevent coupling effect between adjacent bit lines without the need for an additional control circuit such as the bit line select circuit in precharging used in conventional circuits. Furthermore, additional control operation is unnecessary. As a result, it is possible to improve an operation speed of the read-only-memory in precharging.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A bit cell array of a read-only-memory comprising:
    a plurality of bit lines arranged in a row in a first direction;
    a plurality of ground lines arranged in a row in a second direction perpendicular to the first direction;
    a plurality of word lines arranged such that a direction of the word lines changes alternately with respect to the second direction; and
    a plurality of ROM bit cells partially formed at cross points of the bit lines and the word lines, wherein the ROM bit cells are arranged such that a direction in which the ROM bit cells are arranged changes alternately so as not to be arranged in a row on adjacent bit lines.

2. The bit cell array of the read-only-memory as set forth in claim 1, wherein a drain terminal of each of the ROM bit cells is connected to one of the bit lines, and wherein a source terminal is connected to one of the ground lines, and wherein a gate terminal is connected to one of the word lines.

3. The bit cell array of the read-only-memory as set forth in claim 1, wherein two ROM bit cells are formed by four word lines and one bit line.

4. The bit cell array of the read-only-memory as set forth in claim 1, wherein each of two ROM bit cells among ROM bit cells formed in one bit line shares one of the ground lines.

5. The bit cell array of the read-only-memory as set forth in claim 1, wherein the word lines respectively cross up and down with respect to the bit lines.

6. A bit cell array by a basic unit of a read-only-memory comprising:
    first to fourth bit lines successively formed in a row in a first direction;
    first to third ground lines successively formed in a row in a second direction perpendicular to the first direction;
    first to fourth word lines arranged such that a direction of the word lines changes alternately with respect to the second direction; and
    a plurality of ROM bit cells partially formed at cross points of the first to fourth bit lines and the first to fourth word lines, wherein the ROM bit cells are arranged such that a direction in which the ROM bit cells are arranged changes alternately so as not to be arranged in a row on adjacent bit lines.

7. The bit cell array by the basic unit of the read-only-memory as set forth in claim 6, wherein the first and second word lines are formed between the first ground line and the second ground line, and
    wherein the third and fourth word lines are formed between the second ground line and the third ground line.

8. The bit cell array by the basic unit of the read-only-memory as set forth in claim 6, wherein each of the ROM bit cells comprises:
    a drain terminal connected to one of the bit lines;
    a gate terminal connected to one of the word lines; and
    a source terminal connected to one of the ground lines.

9. The bit cell array by the basic unit of the read-only-memory as set forth in claim 6, wherein:
    first and second ROM bit cells are formed at cross points of the first bit line and the second and third word lines, the first and second ROM bit cells sharing the second ground line:
    third and fourth ROM bit cells are formed at cross points of the second bit line and the first and fourth word lines;
    fifth and sixth ROM bit cells are formed at cross points of the third bit line and the second and third word lines, the fifth and sixth ROM bit cells sharing the second ground line; and
    seventh and eighth ROM bit cells are formed at cross points of the fourth bit line and the first and fourth word lines.

10. The bit cell array by the basic unit of the read-only-memory as set forth in claim 9, wherein:
    source terminals of the third and seventh ROM bit cells are connected to the first ground line; and
    source terminals of the fourth and eighth ROM bit cells are connected to the third ground line.

11. The bit cell array by the basic unit of the read-only-memory as set forth in claim 6, wherein the first to fourth word lines are formed crossing up and down with respect to each of the first to fourth bit lines.

* * * * *